(12) United States Patent
Abou-Kandil et al.

(10) Patent No.: US 8,927,857 B2
(45) Date of Patent: Jan. 6, 2015

(54) SILICON: HYDROGEN PHOTOVOLTAIC DEVICES, SUCH AS SOLAR CELLS, HAVING REDUCED LIGHT INDUCED DEGRADATION AND METHOD OF MAKING SUCH DEVICES

(75) Inventors: Ahmed Abou-Kandil, Elmsford, NY (US); Nasser Afify, Oberrieden (CH); Wanda Andreoni, Adliswil (CH); Alessandro Curioni, Gattikon (CH); Augustin J. Hong, White Plains, NY (US); Jeehwan Kim, Los Angeles, CA (US); Petr Khomyakov, Adliswil (CH); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 745 days.

(21) Appl. No.: 13/036,584

(22) Filed: Feb. 28, 2011

(65) Prior Publication Data

US 2012/0216862 A1  Aug. 30, 2012

(51) Int. Cl.
*H01L 31/20* (2006.01)
*H01L 31/0392* (2006.01)
*H01L 21/02* (2006.01)
*H01L 31/0376* (2006.01)
*H01L 31/075* (2012.01)
*C23C 16/24* (2006.01)

(52) U.S. Cl.
CPC ........ *H01L 31/202* (2013.01); *H01L 21/02658* (2013.01); *H01L 21/02422* (2013.01); *Y02E 10/548* (2013.01); *H01L 21/02532* (2013.01); *H01L 21/02592* (2013.01); *H01L 31/0376* (2013.01); *H01L 31/075* (2013.01); *H01L 31/03926* (2013.01); *C23C 16/24* (2013.01)

USPC ................................. 136/258; 438/96; 257/16

(58) Field of Classification Search
CPC ............... H01L 21/02592; H01L 31/03767; H01L 21/02365
USPC .......... 136/258; 438/87, 96; 257/E31.012, 16
See application file for complete search history.

(56) References Cited

U.S. PATENT DOCUMENTS

| | | | |
|---|---|---|---|
| 6,326,304 B1 | 12/2001 | Yoshimi et al. | 438/680 |
| 6,531,654 B2 | 3/2003 | Sugiyama et al. | 136/258 |
| 6,548,751 B2 | 4/2003 | Sverdrup, Jr. et al. | 136/260 |
| 6,713,400 B1 | 3/2004 | Branz | 438/706 |

(Continued)

FOREIGN PATENT DOCUMENTS

WO  WO2010027606  * 3/2010 .......... H01L 31/0384

OTHER PUBLICATIONS

Jones et al, Effect of Mechanical Strain on the Performance of Amorphous Silicon Triple-Junction Solar Cells, 2002, Institue of Electrical and Electronics Engineers, pp. 1214-1217.*

(Continued)

*Primary Examiner* — Jonathan Johnson
*Assistant Examiner* — Bethany Lambright
(74) *Attorney, Agent, or Firm* — Harrington & Smith; Louis J. Percello

(57) ABSTRACT

A method of producing a photovoltaic device includes providing a stretchable substrate for the photovoltaic device; and stretching the substrate to produce a stretched substrate. The method further includes depositing a structure comprising hydrogenated amorphous silicon onto the stretched substrate; and subjecting the deposited hydrogenated amorphous silicon structure and the stretched substrate to a compressive force to form a compressively strained photovoltaic device.

13 Claims, 6 Drawing Sheets

(56) References Cited

U.S. PATENT DOCUMENTS

| | | | |
|---|---|---|---|
| 7,504,279 B2 | 3/2009 | Kroll et al. | 438/57 |
| 7,534,628 B2 | 5/2009 | Takai et al. | 438/5 |
| 7,838,442 B2 | 11/2010 | Sichanugrist et al. | 438/787 |
| 2001/0019903 A1* | 9/2001 | Shufflebotham et al. | 438/788 |
| 2005/0139929 A1* | 6/2005 | Rost | 257/369 |
| 2006/0169989 A1* | 8/2006 | Bhattacharya et al. | 257/79 |
| 2010/0075261 A1 | 3/2010 | Clevenger et al. | 430/314 |
| 2010/0175750 A1 | 7/2010 | Gambino et al. | 136/256 |
| 2010/0221867 A1 | 9/2010 | Bedell et al. | 438/96 |
| 2010/0297800 A1 | 11/2010 | Hovel et al. | 438/66 |
| 2010/0297802 A1 | 11/2010 | Becker et al. | 438/67 |
| 2011/0226330 A1* | 9/2011 | Grossman et al. | 136/258 |

OTHER PUBLICATIONS

Nakamura, William M., et al., "Optical Emission Spectroscopy of a Magnetically Enhanced Multi-hollow Discharge Plasma for a-Si:H Deposition", J. Plasma Fusion Res. Series, vol. 8, 2009, 4 pgs.

Shimizu, Tatsuo, "Staebler-Wronski Effect in Hydrogenated Amorphous Silicon and Related Alloy Films", Japan Society of Applied Physics, vol. 43, No. 6A, 2004, pp. 3257-3268.

Soderstrom, Thomas, et al., "Single and multi-junction thin film silicon solar cells for flexible photovoltaics", Rero bibliotheque numerique RERO DOC: Notice #11889, Dec. 1, 2010, 3 pgs.

Wronski, C.R., et al., "Progress in Amorphous Silicon Based Solar Cell Technology", RIO 02—World Climate & Energy Event, Jan. 6-11, 2002, 6 pgs.

"Technology Roadmap: Dupont™ Kapton® polyimide films for flexible and thin film photovoltaic substrates", http://www.2.dupont.com/Photovoltaics/en_US/products_services/thinfilm_substrates/kap . . . ; Dec. 28, 2010, 1 pg.

D. Han, "Search for Factors Determining the Photodegradation in High-Efficiency a-Si:H-based Solar Cells, Phase 1 Annual Technical Progress Report Jan. 16, 1998-Jan. 15, 1999", NREL/SR-520-26522, May 1999, 34 pgs.

Munyeme, Geoffrey, "Experimental and Computer Modelling Studies of Metastability of Amorphous Silicon Based Solar Cells", ISBN 90-393-3310-6, 2003, 139 pgs.

* cited by examiner

| Strain | Status | Efficiency (%) | Shunt Resistance (Ohm-cm²) |
|---|---|---|---|
| Neutral | No Soaking | 6.5 | 530 |
| | Soaking | 5.5 | 417 |
| | % Degradation | -15.4% | -21% |
| Tensile | No Soaking | 7.4 | 1100 |
| | Soaking | 6 | 560 |
| | % Degradation | -19.0% | -49% |
| Compressive | No Soaking | 7.4 | 950 |
| | Soaking | 6.3 | 775 |
| | % Degradation | -14.8% | -18% |

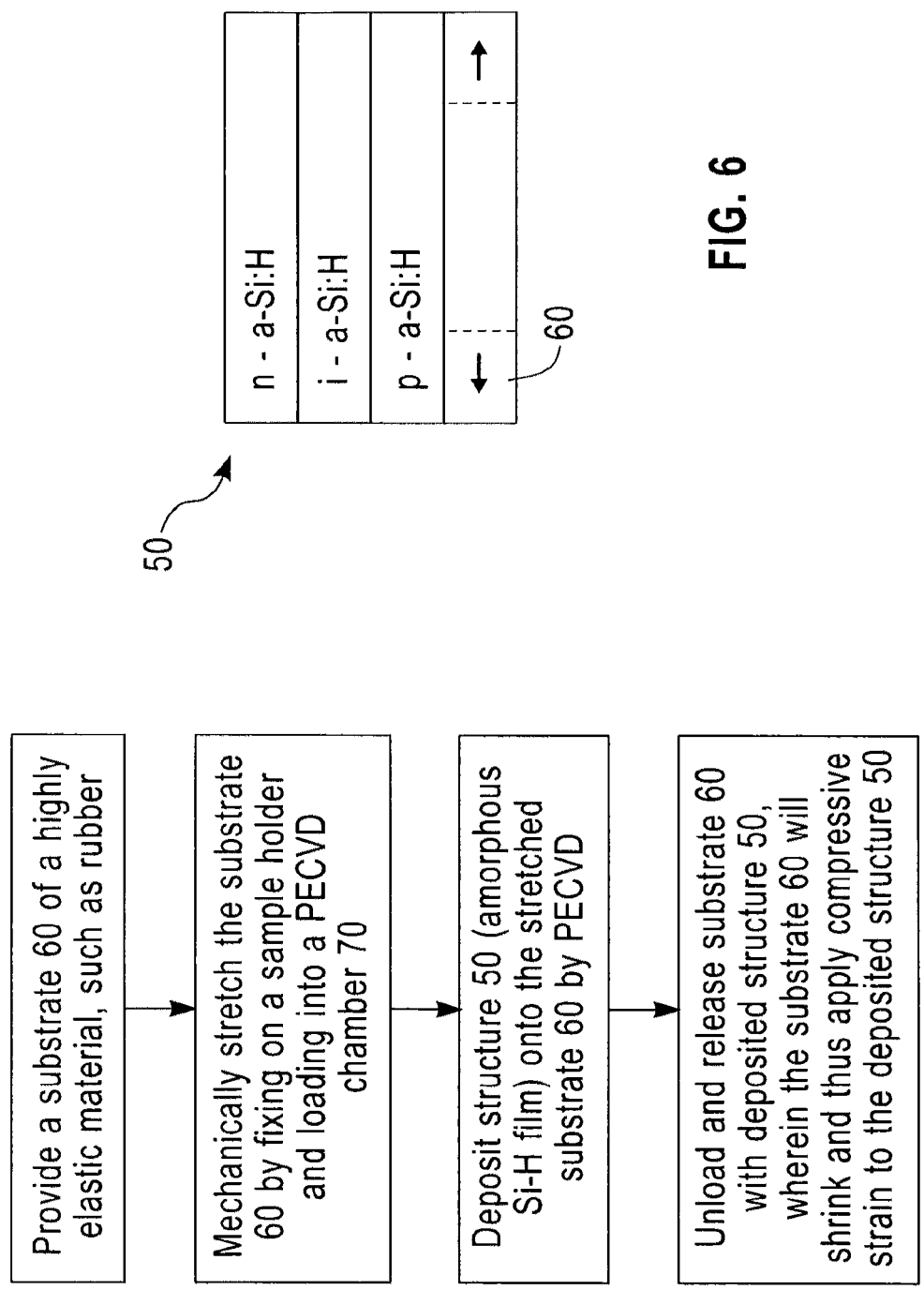

SILICON: HYDROGEN PHOTOVOLTAIC DEVICES, SUCH AS SOLAR CELLS, HAVING REDUCED LIGHT INDUCED DEGRADATION AND METHOD OF MAKING SUCH DEVICES

TECHNICAL FIELD

Exemplary and non-limiting embodiments of the invention relate to silicon: hydrogen photovoltaic devices, such as solar cells, and more specifically, to hydrogenated amorphous silicon:hydrogen solar cells having reduced light-induced degradation and methods of making the same.

BACKGROUND

This section endeavors to supply a context or background for the various exemplary and non-limiting embodiments of the invention as recited in the claims. The content herein may comprise subject matter that could be utilized, but not necessarily matter that has been previously utilized, described or considered. Unless indicated otherwise, the content described herein is not considered prior art, and should not be considered as admitted prior art by inclusion in this section.

Alternative methods of producing energy are continually being sought. One such method is solar or photovoltaic technology, which converts sunlight into electrical energy.

A photovoltaic device is a device that converts the energy of incident photons to electromotive force (e.m.f.). A solar cell is an example of a photovoltaic device, which converts sunlight into electricity. In particular, solar cells are configured to convert the energy in the electromagnetic radiation from the sun to electrical energy.

Hydrogenated amorphous silicon based solar cells have shown promise in the art as a candidate for low cost solar cells, particularly with respect to semiconductor applications. Amorphous silicon is a potentially attractive material for photovoltaic devices, such as solar cells, due in part to its absorptivity, which thus allows production of thin film solar cells from this material. The substrate of such types of hydrogenated amorphous silicon based solar cells is often made of glass.

However, amorphous silicon degrades over time upon exposure to light. Thus, efficiencies are lost due to this degradation as the amount of light that may be converted to electricity is reduced. Thus, a problem associated with the effective application of such materials is light induced degradation of the amorphous silicon:hydrogen films, which often adversely affects the structure and stability of such devices thereby limiting the effective application and use of such amorphous silicon based devices as a widespread alternative energy source.

Accordingly, there exists a need for alternative constructions and method of producing photovoltaic devices, including solar cells, for applications such as semiconductor devices.

BRIEF SUMMARY

According to one embodiment of the invention, a method of producing a photovoltaic device comprises providing a stretchable substrate for the photovoltaic device; stretching the substrate to produce a stretched substrate; and depositing a structure comprising hydrogenated amorphous silicon onto the stretched substrate. The method further comprises subjecting the deposited hydrogenated amorphous silicon structure and the stretched substrate to a compressive force to form a compressively strained photovoltaic device.

According to another embodiment of the invention, a method of producing a solar cell comprises providing a stretchable substrate; mechanically stretching the stretchable substrate and fixing on a sample holder in a plasma enhanced chemical vapor deposition chamber to produce a stretched substrate; and depositing a structure comprising hydrogenated amorphous silicon onto the stretched substrate by plasma enhanced chemical vapor deposition. The method further comprises subjecting the deposited structure and the stretched substrate to a compressive force to form a compressively strained solar cell.

According to a further embodiment of the invention, a compressively strained semiconductor device comprises a mechanically stretchable substrate, and a structure comprising hydrogenated amorphous silicon on the substrate; wherein the structure comprising hydrogenated amorphous silicon is compressively strained upon release of stretching.

According to another embodiment of the invention, a method of producing a photovoltaic device comprises providing a substrate; depositing a structure comprising hydrogenated amorphous silicon onto the substrate by plasma enhanced chemical vapor deposition, wherein the structure comprises between about 0.1 atomic % and about 5 atomic % of Ge doped into the silicon during deposition of the structure.

BRIEF DESCRIPTION OF THE SEVERAL VIEWS OF THE DRAWINGS

Embodiments of the invention can be understood by reference to the following detailed description when read in conjunction with the accompanying drawings, wherein:

FIG. 5 is a flow chart showing a method of deposition using a stretched substrate according to an embodiment of the invention;

FIG. 6 shows a schematic illustration of an amorphous Si:H p-i-n structure deposited on a stretchable substrate, in accordance with embodiments of the invention;

DETAILED DESCRIPTION

Figure 1:
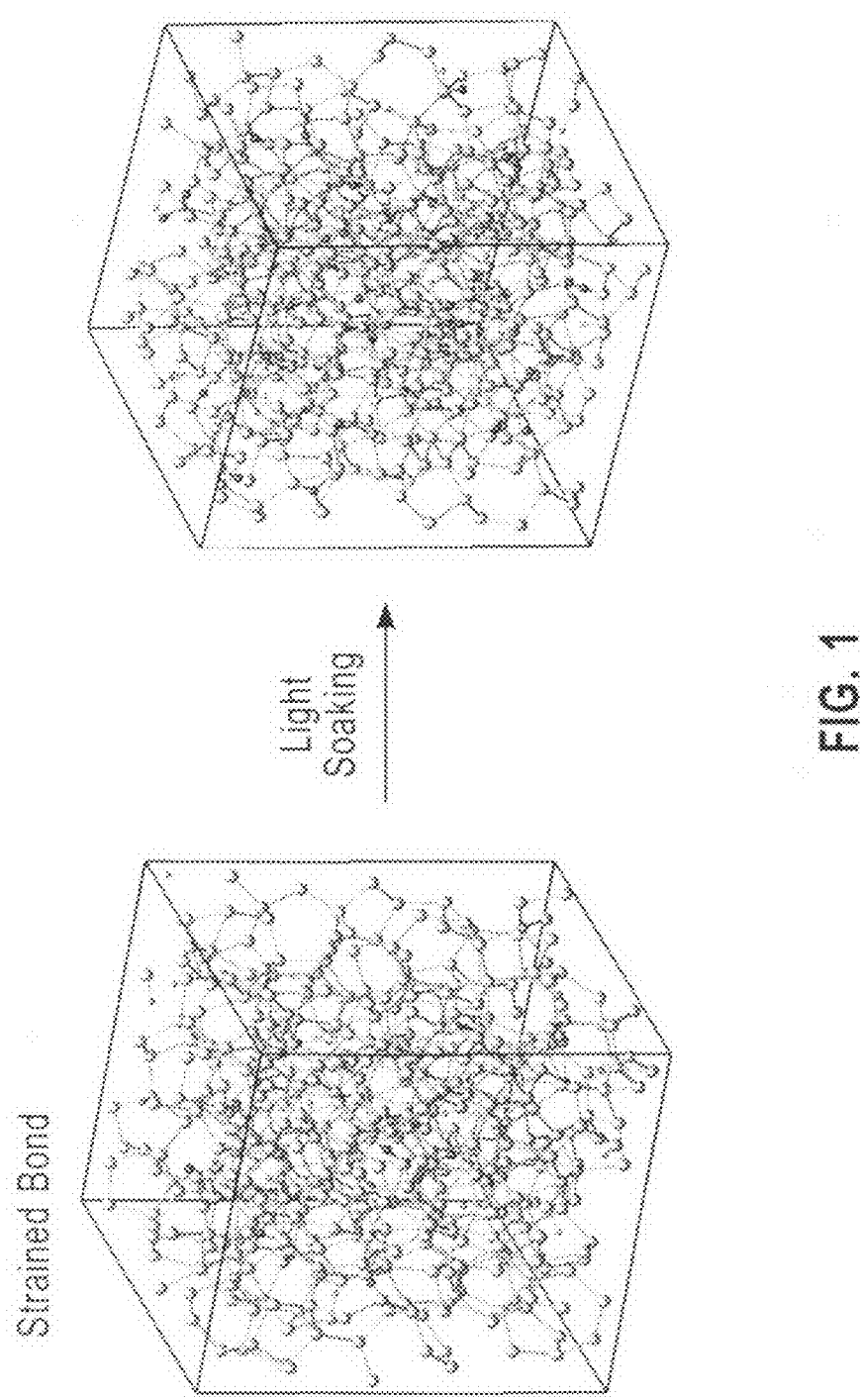
FIG. 1 is an illustration of the effect of light soaking on silicon bonding properties, in accordance with an embodiment of the invention.

The terminology used herein is for the purpose of describing particular embodiments only and is not intended to be limiting of the invention. As used herein, the singular form "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of any means or step plus function elements in the claims below are intended to include any structure, material, or act for performing the function in combination with other claimed elements as specifically claimed. The description of the invention has been presented for purposes of illustration and description, but is not intended to be exhaustive or limited to the invention in the form disclosed. Many modifications and variations will be apparent to those or ordinary skill in the art without departing from the scope and spirit of the invention. The embodiments of the invention were chosen and described in order to best explain the principles of the invention and the practical application, and to enable others of ordinary skill in the art to understand the invention for various embodiments with various modifications as are suited to the particular use contemplated.

Additionally, it is to be understood that embodiments of the invention are described in terms of a solar cell; however, other architectures, structures, substrate materials and process features may be varied within the scope of embodiments of the invention. For example, it is noted that a circuit as described herein may be part of a design for an integrated circuit chip. The chip design may be created by a graphical computer programming language, and stored in a computer storage medium (such as a disk, tape, physical hard drive, or virtual hard drive such as in a stored access network). If the designer does not fabricate chips or the photolithographic masks used to fabricate ships, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic mask, which typically include multiple copies of the chip design in question that are to be formed on a wafer. The photolithographic masks can be used to define areas of the wafer (and/or the layers thereon) to be etched or otherwise processed. Thus, methods as described herein may be used in the fabrication of integrated circuit chips and/or solar cells. The resulting integrated circuit chips or cells can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes, for example, photovoltaic devices, integrated circuit chips with solar cells, ranging from toys, calculators, solar collectors, including low-end applications to advanced computer products having a display, a keyboard or other input device, and a central processor. Embodiments of the invention thus also can include code to control any processing chambers to fabricate the resultant devices.

FIG. 1 shows a simulation of the effect of light soaking on silicon bonding properties of hydrogenated amorphous silicon (a-Si:H). As shown therein, tensile strain bond increases with light soaking. Tensile strain in hydrogenated amorphous silicon is believed to cause light induced degradation.

Figure 2:
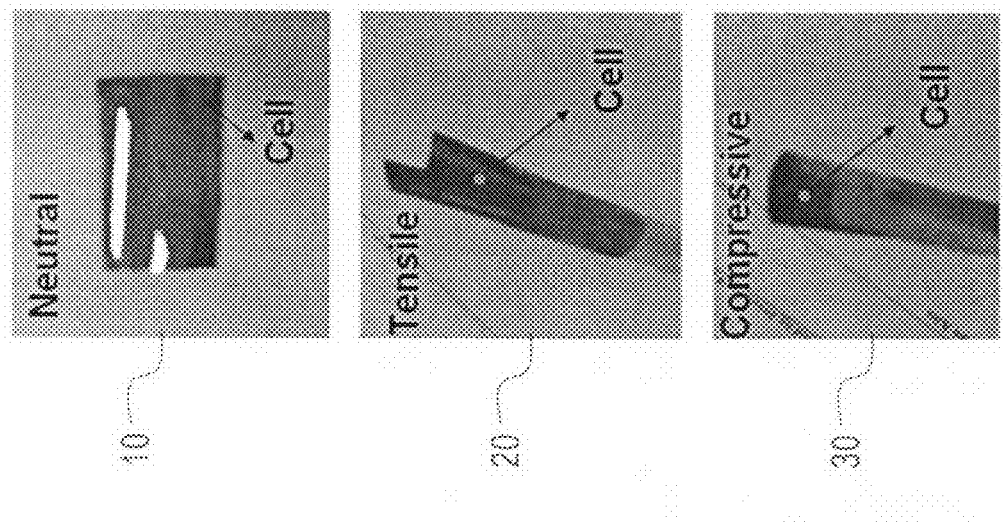
FIG. 2 shows experimental results of twenty-four hours of light soaking on strained cells, in accordance with an embodiment of the invention.

As shown in FIG. 2, an experiment was conducted to expose strained cells to twenty-four hours of light soaking. In particular, an a-Si:H n-i-p structure was deposited on a metal coated plastic substrate (Kapton® film) at about 250° C. by using plasma enhanced chemical vapor deposition (PECVD). Deposition sequence of full stack of a-Si:H solar cells may be summarized as follows: 10 nm~100 nm thick Al or Ti adhesion layer on Kapton® 15 nm, 10 nm~100 nm Ag reflector, 50 nm~300 nm ZnO:Al back-reflector/diffusion barrier, 15 nm n-type a-Si:H, 350 nm intrinsic a-Si:H, and 15 nm p-type a-Si:H. For n-type doping, silane gas may be flowed together with phosphine gas. For p-type doping, silane and diborane are flowed together. Kapton® polymide films are manufactured by DuPont and have a low coefficient of thermal expansion (CTE) and remain stable over a wide range of temperatures. The chemical name for Kapton® K and HN is poly(4, 4'-oxydiphenylene-pyromellitimide). The total thickness of the n-i-p stack was about 350 nm.

The stack on the Kapton® film then was soaked under sunlight with 1 sun intensity for about twenty-four hours. To apply tensile strain, the top surface of the substrate including cell was bent with a positive curvature. The cell was bent with a negative curvature for applying compressive strain. The percentage degradation after twenty-four hours of light-soaking was measured for neutral, compressive, and tensile cells. The tensile strained cell 20 demonstrated the highest percentage degradation while compressive cell 30 and neutral cell 10 showed lower levels of percent degradation. However, the tensile strained cell 20 showed a much higher percent of degradation, which is believed to primarily be due to fill factor loss originated from an increase in shunting. The minimum efficiency degradation observed for compressively strained cell 30 is believed to be mainly due to the least shunt resistance degradation.

As can be seen by the results of the foregoing set forth in FIG. 2, more degradation was observed for the tensile strained cell 20 and less degradation was observed for the compressive strained cell 30. Thus, it was concluded that compressive strain is more resistive to degradation.

Figure 3:
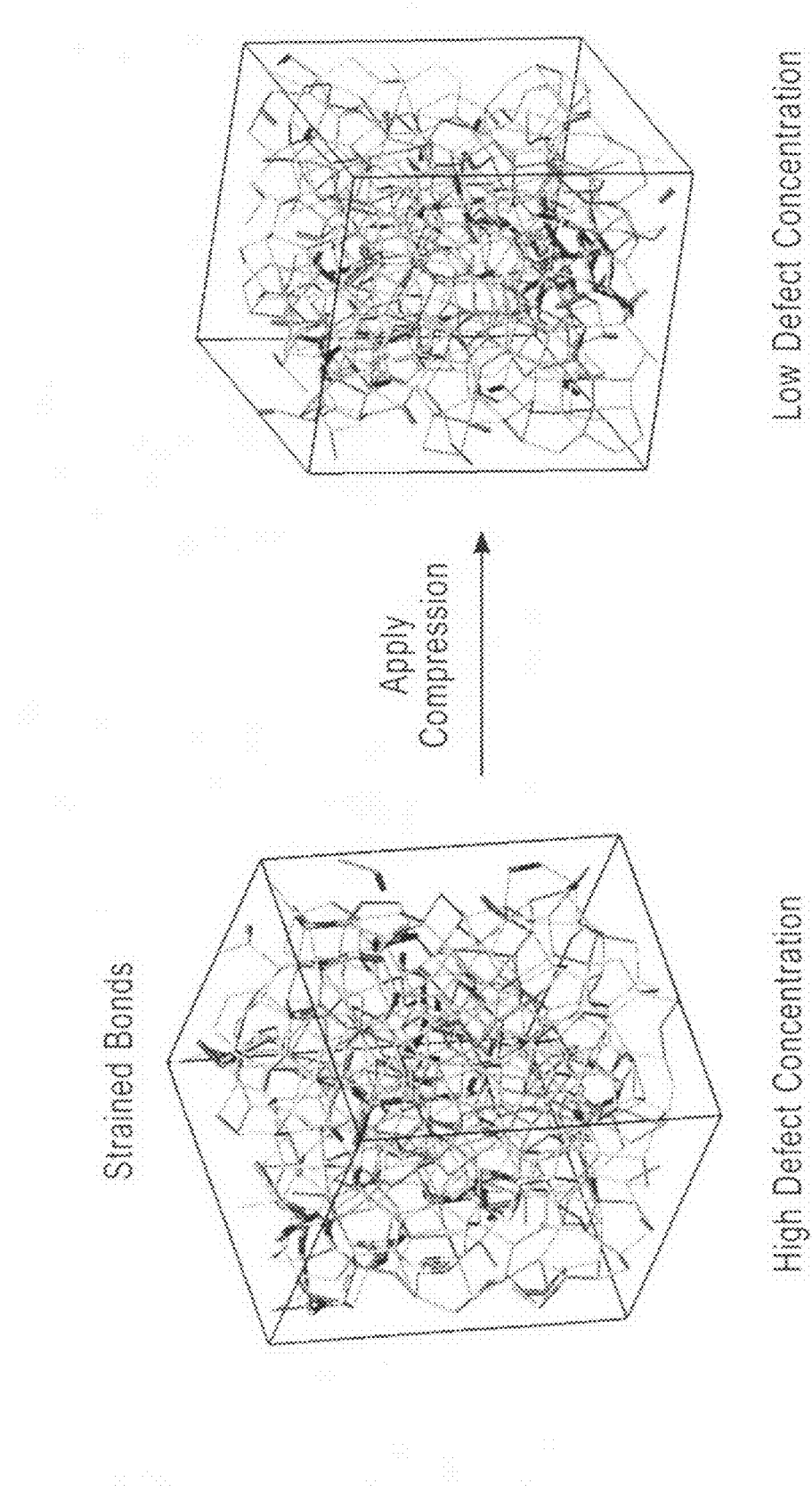
FIG. 3 is an illustration of the effect of external stress on silicon bonding properties, in accordance with an embodiment of the invention.

FIG. 3 shows a simulation of the effect of external stress on hydrogenated amorphous silicon bonding properties. As shown therein, strained bonds are subject to a high defect concentration. Upon applying compression, a low defect concentration of the bonds results. Thus, macroscopic stress changes upon decreasing the number of strained bonds. The defect concentration correlates with macroscopic stress of hydrogenated amorphous silicon (a-Si:H) model structures. Thus, it is believed that defect concentration changes if external pressure is applied.

Simulation by the inventors has shown that the application of compressive pressure results in a low defect concentration. More particularly, applying compression reduces the degradation as verified by experiment and simulation by the inventors. This conclusion by the inventors has significant application in producing photovoltaic devices, such as solar cells, having reduced light induced degradation.

The inventors have thus determined that a compressive strained hydrogenated amorphous silicon (e.g., amorphous Si:H) device, such as a solar cell, having reduced light induced degradation can be obtained by using a stretchable substrate.

Figure 4:
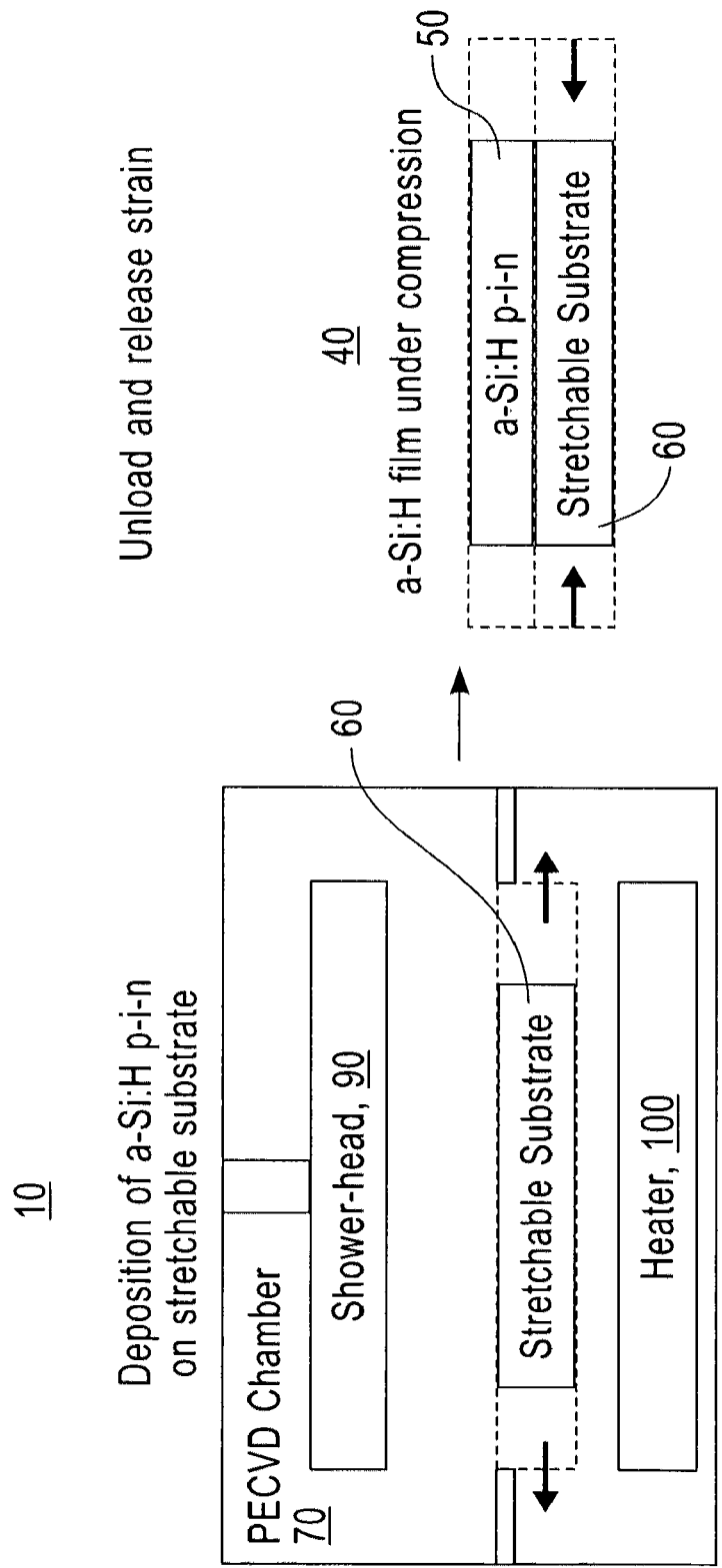
FIG. 4 is an illustration of a method to make a compressive strained amorphous silicon hydrogen device, in accordance with an embodiment of the invention.

As shown in FIG. 4, according to an embodiment of the invention, a method of making a compressive strained amorphous hydrogenated device, such as a solar cell 40, comprises depositing an amorphous Si:H film 50, such as an amorphous Si:H p-i-n structure, on a stretchable substrate 60. Alternatively, as further described below, a Si:H n-i-p structure may also be employed.

First, a suitable stretchable substrate 60 for the compressive strained amorphous hydrogenated device is provided. According to an embodiment, the substrate 60 may be made of any suitable stretchable material, including rubber, elastic materials such as high temperature plastic or polymeric materials and metals. The substrate 60 may be between about 200 and about 300° C. resistive. A substrate of about 250° C. resistive is particularly suitable. Moreover, the substrate 60 should be sustainable at about 250° C. and be capable of applying more than about 1% of elastic strain. Further examples of substrate materials include, but are not limited to, neoprene, silicone rubber, and Viton® synthetic rubber and fluoropolymer elastomers. Vitron® is a registered trademark of DuPont Performance Elastomers. It is desirable for substrate 60 to be elastic and resistant (sustainable) at high process temperatures of about 200° C. to about 300° C. Thus, according to an embodiment of the invention, the stretchable substrate 60 comprises a high temperature material, such as rubber or polymeric material, which can be elastic under processing temperatures of about 200° C. to about 300° C. so that the strain may be zero upon release from the stretching state. When this material is released from elastic tension (stretching), the strain may be applied to the p-i-n stack (or other desired stack) as a compressive strain form.

According to an embodiment, the substrate 60 is subjected to stretching and elongation of the substrate 60, as shown in FIG. 4, prior to any layers being deposited onto the substrate 60. More particularly, according to one exemplary and non-limiting embodiment and as shown in FIG. 5, using a highly elastic polymer or rubber as substrate 60, this material may be mechanically stretched and the strain held by fixing the substrate 60 onto a sample holder by clip or high temperature glue, for instance, and loaded into a plasma enhanced chemical vapor deposition (PECVD) chamber, further described below. When this elastic material is unloaded and released from the holder, the substrate 60 will shrink and apply compressive strain to a deposited amorphous Si:H film 50.

An amorphous Si:H film 50 then may be deposited on the stretchable substrate 60. It is noted that amorphous Si:H films 50 are known in the art and the structure for film 50 may comprise any suitable structure, such as a p-i-n structure, n-i-p structure, etc. For example, suitable structures for photovoltaic devices, such as solar cells, are described in U.S. patent application Ser. No. 12/835,238, filed on Jul. 13, 2010, entitled, A Solar Cell Employing an Enhanced Free Hole Density P-Doped Material and Methods for Forming the Same, the contents or which are hereby incorporated by reference.

Additionally, the deposition method employed may be any suitable deposition method known in the art, including but not limited to chemical vapor deposition (CVD) and plasma enhanced chemical vapor deposition (PECVD) from, for example, silane gas and hydrogen gas. Plasma enhanced chemical vapor deposition (PECVD) is an effective method for depositing successive layers of a semiconductor device. For example, the p-i-n layers may be successively deposited by single or multichamber plasma enhanced chemical vapor deposition. Such plasma deposition is desirable as a solar cell can be made at temperatures below 300° C. Although plasma deposition in a single chamber may be more economical than multichamber deposition, multichamber PECVD also may be employed to deposit the p and i layers in different chambers to help avoid cross contamination of any employed doping agents. For example, the layers may be doped with other elements, such as boron, to enhanced desirable properties such as electrical conductivity.

Thus, according to one exemplary and non-limiting embodiment of the invention and as shown in FIG. 4, the stretchable substrate 60 may be arranged in a chamber, such as an inner chamber 70 of a PECVD system 80. PECVD systems are known in the art, and PECVD is a known process by which thin films can be deposited from a vapor onto a substrate via chemical reactions after a plasma is created by the reacting gases. PECVD is often employed in the production of thin film semiconductor devices.

The PECVD inner chamber 70 of FIG. 4 may be a hot wall inner chamber disposed within a vacuum chamber connected to a vacuum line (not shown). A showerhead 90, as shown in FIG. 4, can be incorporated within a radio frequency (RF) electrode placed inside the inner chamber 70. The showerhead 90 can be connected to desired gas feed lines to introduce the appropriate reacting gases. A heater 100 also may be disposed within chamber 70.

Thus, as further shown in FIG. 4, stretchable substrate 60 may be arranged above heater 100 in the inner chamber 70. According to one embodiment using a highly elastic polymer or rubber for substrate 60, substrate 60 is mechanically stretched by fixing substrate 60 onto a sample holder (not shown) and then loaded into the PECVD chamber 70.

A desired amorphous Si:H film 50 may then be deposited onto the stretched substrate 60. It is noted that the substrate 60 may be coated with any desirable coating layer of suitable thickness prior to deposition of film 50. For example, a thin metal adhesion layer between about 10 and 100 nm thick may be employed. An initial n type semiconductor layer of amorphous Si:H may then be deposited onto stretchable substrate 60 by introducing the desired reacting gas, as is known in the art, into the inner chamber 70 through showerhead 90. A doping agent, such as phosphine gas for example, also may be introduced. After deposition of the initial n layer onto stretchable substrate 60, an intrinsic layer (i layer) of amorphous Si:H and then the p type semiconductor layer of amorphous Si:H (p layer) may be successively deposited in the same reactor (or different reactor). The deposition conditions for these layers may be same as those employed for the deposition of the initial n layer, with appropriate reacting gases such as diborane gas, as would be known to those skilled in the art.

It is noted that embodiments of the invention apply to both n-i-p and p-i-n structures, and the arrangement may vary based on, for example, the type of substrate 60 employed. A n-type may be the first layer for n-i-p structures deposited on, for example, opaque substrates. However, when the substrate is transparent, p-type may be the first layer for p-i-n structures. As the p-type should be exposed to the light first, a n-i-p arrangement may be used for an opaque substrate 60 and p-i-n arrangement for a transparent substrate 60. In the experiment described above with reference to FIG. 2, an opaque Kapton® substrate was used with a n-i-p structure configuration. If the substrate 60 is a transparent plastic substrate then deposition sequence also may include a p-i-n structure configuration.

It is further noted that the thickness of the materials described herein, including layers of the stack and substrates, may be of any suitable thickness for the desired application.

FIG. 6 shows a schematic illustration of an example of an amorphous Si:H film 50 deposited on the stretchable substrate 60. The amorphous Si:H film 50 and the stretchable substrate 60 onto which the structure 50 is deposited may be subjected to a compressive force as schematically shown in FIG. 4, whereupon unloading and release of the strain produces a compressive strained amorphous hydrogenated device, such as solar cell 40, which has improved resistance to light induced degradation. More particularly, the stretching of the substrate 60 and subsequent compressive strain of the structure 50 and substrate 60 may be from 0.5% to 2% for having effective resistance to light degradation. The substrate 60 may have about 0.5% to about 2% of tensile strain before loading into the chamber of a PECVD device, for instance. Subsequently, an amorphous Si:H p-i-n stack, or other desired stack, can be deposited on top of the about 0.5% to about 2% strained stretchable substrate. Upon unloading from the PECVD device and releasing the substrate 60 from restriction, the stack can be under the desired strain of about 0.5% to about 2%. Thus, the structure may subjected to a compressive strain of about 0.5 to about 2% compression by stretching the substrate 60 up to the strain of about 0.5% to about 2%, depositing the structure and releasing after deposition, wherein when the stretched substrate is released from restriction after deposition, the compressive strain is applied to the structure.

Figure 8:
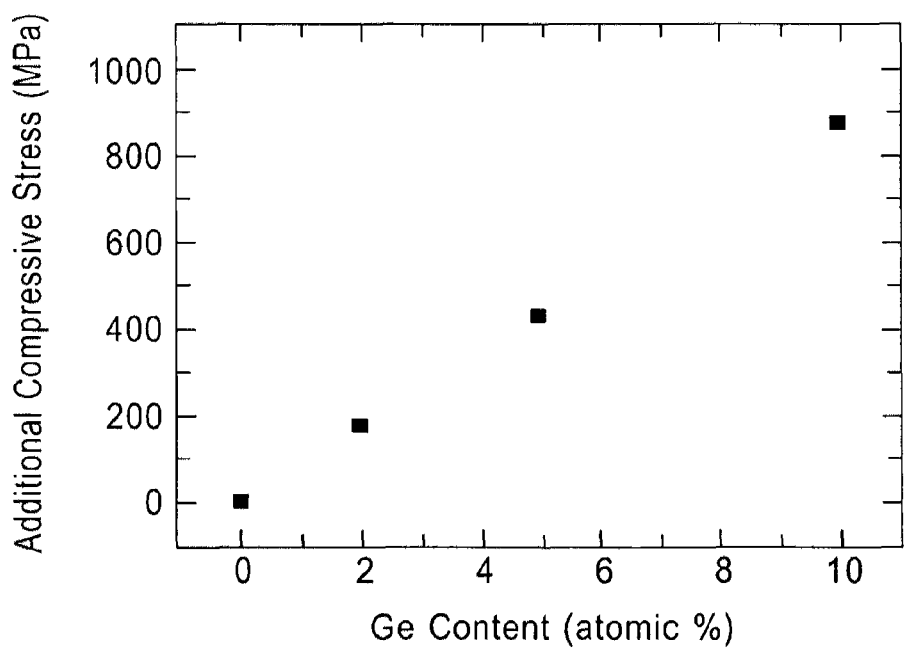
FIG. 8 shows an example of the effect of Ge content on additional stress application, according to an embodiment of the invention.

According to an alternative embodiment of the invention, doping a-Si:H film with small amounts of germanium (Ge) up to about 5 atomic %, whose atomic radius is larger than Si also can result in local compressive strain. For instance, examples of amounts of germanium include, but are not limited to, between about 0.1 atomic % to about 5 atomic %, between about 0.2 atomic % to about 0.4 atomic %, and between about 0.3 atomic % and about 0.4 atomic %. Thus, for an external source of compressive strain, stretchable substrate 60 may be employed, as described above. Alternatively, for an internal source of compressive strain, Ge doping may be employed alone. More particularly, up to about 5% of atomic Ge as described above may be incorporated by, for example, flowing germane gas together with silane gas during intrinsic amorphous film deposition. Ge can be added to p and/or n layers, optionally. For example, it may be added to either or both of the p and n layers during deposition. The effect of Ge content on additional stress application is shown in FIG. 8. As FIG. 8 demonstrates, stress level in the films linearly increases with Ge content increase in the films by adding local compressive stress.

Thus, an alternate embodiment of the invention includes a method of producing a photovoltaic device comprising: providing a substrate; depositing a structure comprising hydrogenated amorphous silicon onto the substrate by plasma enhanced chemical vapor deposition, wherein the structure comprises between about 0.1 atomic % and about 5 atomic % of Ge doped into the silicon during deposition of the structure. It is noted that according to this embodiment, the substrate may be any desired substrate and not necessarily a stretchable substrate 60, as described above. For example, suitable other substrates include, but are not limited to glass, metal and other known substrates.

As a further alternative embodiment, a combination of the techniques described herein may be employed.

Figure 7:
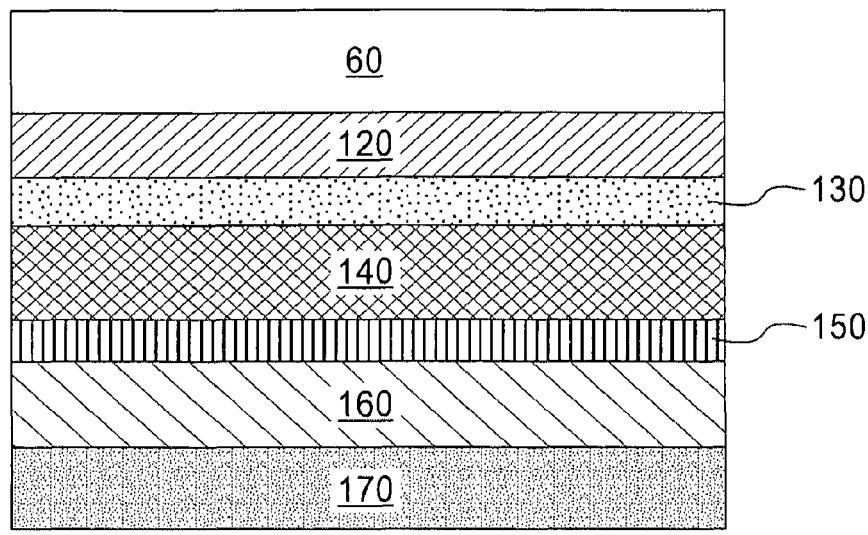
FIG. 7 shows a photovoltaic device in accordance with an embodiment of the invention.

As a further non-limiting example and as shown in FIG. 7, a photovoltaic device structure can include a material stack, from top to bottom, of stretchable substrate 60, a transparent conductive material layer 120, a p-doped semiconductor layer 130, an intrinsic semiconductor layer 140, an n-doped semiconductor layer 150, a first back reflector layer 160, and a second back reflector layer 170. The substrate 60 also can include an optically transparent material layer 120 that functions as a positive node, and the combination of the second back reflector layer 170 can function as a negative node of the photovoltaic device. The first back reflector layer 160 can be optically transparent, and the combination of the first and second back reflector layers (160, 170) reflect any photons that pass through the stack of the p-doped semiconductor layer 130, the intrinsic semiconductor layer 140, and the n-doped semiconductor layer 150 to enhance the efficiency of the photovoltaic device. The p-doped semiconductor layer 130 can include an amorphous p-doped hydrogenated silicon-containing material or microcrystalline p-doped hydrogenated silicon-containing material. The amorphous p-doped hydrogenated silicon-containing material or the microcrystalline p-doped hydrogenated silicon-containing material can be deposited by flowing a semiconductor-material-containing reactant in hydrogen carrier gas. In this case, hydrogen atoms are incorporated in the deposited material of the p-doped semiconductor layer 130. The p-doped semiconductor layer 130 can include an amorphous p-doped hydrogenated silicon-carbon alloy or a microcrystalline.

As a result of the inventors' developments, alternative constructions and methods of producing photovoltaic devices, including solar cells, for applications such as semiconductor devices can be realized, which have reduced light induced degradation. Thus, efficiencies of such resultant devices are enhanced by the inventors' developments.

It will be appreciated by those skilled in the art that while the deposited amorphous Si:H film 50 for the photovoltaic devices described herein has been described above with respect to an a-Si—H p-i-n or n-i-p structure, amorphous Si:H film 50 can comprise any other suitable materials, layers and arrangement thereof. Thus, it also should be noted that while various embodiments are described herein, it will be appreciated from the specification that various combinations of elements, various materials, variations or improvements thereof may be made by those skilled in the art, and are within the scope of the invention.

What is claimed is:

1. A method of producing a photovoltaic device comprising:
   providing a stretchable substrate for the photovoltaic device;
   stretching the substrate to produce a stretched substrate wherein the stretching of the substrate comprises linearly elongating the substrate by applying a force to each of the opposite ends of the substrate;
   depositing a structure comprising hydrogenated amorphous silicon onto the stretched substrate; and
   subjecting the deposited hydrogenated amorphous silicon structure and the stretched substrate to a compressive force to form a compressively strained photovoltaic device;
   wherein the substrate is subject to the stretching prior to the depositing of the structure.

2. The method of claim 1, wherein the compressively strained photovoltaic device is a compressively strained solar cell.

3. The method of claim 1, wherein the structure is subjected to a compressive strain of about 0.5 to about 2% compression by stretching the substrate up to the strain of about 0.5% to about 2%, depositing the structure and releasing after deposition, wherein when the stretched substrate is released from restriction after deposition, the compressive strain is applied to the structure.

4. The method of claim 1, wherein the structure is deposited by plasma enhanced chemical vapor deposition.

5. The method of claim 1, wherein stretchable substrate comprises a high temperature rubber or high temperature plastic, which is capable of being elastic at a process temperature of about 200° C. to about 300° C.

6. The method of claim 1, wherein the structure comprising hydrogenated amorphous silicon is an amorphous p-i-n structure or an amorphous n-i-p structure.

7. The method of claim 1, wherein the stretchable substrate is mechanically stretched and fixed on a sample holder in a plasma enhanced chemical vapor deposition chamber.

8. A method of producing a solar cell comprising:
providing a stretchable substrate;
mechanically stretching the stretchable substrate and fixing on a sample holder in a plasma enhanced chemical vapor deposition chamber to produce a stretched substrate, wherein the stretching of the stretchable substrate comprises linearly elongating the stretchable substrate by applying a force to each of the opposite ends of the stretchable substrate;
depositing a structure comprising hydrogenated amorphous silicon onto the stretched substrate by plasma enhanced chemical vapor deposition; and
subjecting the deposited structure and the stretched substrate to a compressive force to form a compressively strained solar cell;
wherein the substrate is subjected to the stretching prior to the depositing of the structure.

9. The method of claim 8, wherein stretchable substrate comprises a high temperature rubber or high temperature plastic, which is capable of being elastic at a process temperature of about 200° C. to about 300° C.

10. The method of claim 1, wherein the substrate is selected from the group consisting of neoprene, rubber, elastomer, and combinations thereof.

11. The method of claim 8, wherein the substrate is selected from the group consisting of neoprene, rubber, elastomer, and combinations thereof.

12. The method of claim 1, wherein the stretching of the substrate comprises stretching only the substrate, and wherein the stretching of the substrate is performed prior to any layers being deposited onto the substrate.

13. The method of claim 1, wherein the stretching of the substrate further comprises elongating the substrate in elastic tension, wherein the structure is subjected to a compressive strain of 2% compression by stretching the substrate up to the strain of about 0.5% to about 2%, depositing the structure and releasing after deposition, wherein when the stretched substrate is released from restriction after deposition, the compressive strain is applied to the structure.

* * * * *